(12) United States Patent
Cioc et al.

(10) Patent No.: US 7,892,721 B2
(45) Date of Patent: Feb. 22, 2011

(54) STORAGE MEDIUM

(76) Inventors: Alexander Cioc, Kaplan-Mertona-Strasse 5, 47533 Kleve (DE); Gerhard Fehr, Brammenfeld 5, 47533 Kleve (DE); Reinhard Borek, Grafestrasse 12, 06110 Halle (DE); Thomas Rainer, Noschonroder Strasse 81, 38855 Wernigerode (DE); Jochen Schneider, Ahornweg 10, 06132 Halle (DE); Klaus-Jürgen Berg, Feldrain 36, 06130 Halle (DE); Gunnar Berg, Anhalter Strasse 12, 06108 Halle (DE)

( * ) Notice: Subject to any disclaimer, the term of this patent is extended or adjusted under 35 U.S.C. 154(b) by 544 days.

(21) Appl. No.: 10/531,962

(22) PCT Filed: Aug. 12, 2003

(86) PCT No.: PCT/EP03/08920

§ 371 (c)(1),
(2), (4) Date: Nov. 7, 2005

(87) PCT Pub. No.: WO2004/038713

PCT Pub. Date: May 6, 2004

(65) Prior Publication Data

US 2006/0114801 A1 Jun. 1, 2006

(30) Foreign Application Priority Data

Oct. 21, 2002 (DE) ................... 102 49 095

(51) Int. Cl.
*G03C 5/00* (2006.01)
(52) U.S. Cl. .................. 430/290; 430/330; 430/945
(58) Field of Classification Search ............... 428/64.2, 428/64.4, 64.7; 430/270.11, 270.12, 346, 430/616, 290, 330, 945
See application file for complete search history.

(56) References Cited

U.S. PATENT DOCUMENTS 2,732,298 A * 1/1956 Stookey .................. 430/348

(Continued)

FOREIGN PATENT DOCUMENTS

DE 19724214 12/1998

(Continued)

OTHER PUBLICATIONS

Nomura, Akihiko et al., Super resolution read-oly memory disk with metal nanoparticles or small aperture, The Japan Society of Applied Phys. Pt 1, vol. 41 (3B), pp. 1876-1879, Mar. 2002 Imported as NomuraEtAl.pdf.*

(Continued)

*Primary Examiner*—Mark Ruthkosky
*Assistant Examiner*—Gerard T Higgins
(74) *Attorney, Agent, or Firm*—Andrew Wilford

(57) ABSTRACT

The invention relates to a storage medium for storing information/data, wherein the storage medium comprises a dielectric storage material, more particularly a disk-shaped storage material on which a metal ion donor medium is arranged or can be applied on at least one side thereof. Metal ions can be transferred from the donor medium into the storage medium by exposing the storage medium to radiation, more particularly to laser radiation. The invention also relates to a storage medium for storing information/data, wherein the storage medium comprises a dielectric storage material, more particularly a disk-shaped storage material having at least one local metal ion doping, wherein the metal ions can be converted into metal particles and/or metal particles agglomerations by means of radiation, more particularly laser radiation.

9 Claims, 1 Drawing Sheet

U.S. PATENT DOCUMENTS

| | | | |
|---|---|---|---|
| 4,269,917 A | * 5/1981 | Drexler et al. | 430/16 |
| 4,304,848 A | 12/1981 | Bouldin et al. | |
| RE31,220 E | * 4/1983 | Ernsberger | 65/30.13 |
| 4,762,770 A | * 8/1988 | Bouldin et al. | 430/270.11 |
| 4,782,006 A | 11/1988 | Nishimura et al. | |
| 4,913,717 A | * 4/1990 | Cooper | 65/30.13 |
| 5,078,771 A | 1/1992 | Wu | |

FOREIGN PATENT DOCUMENTS

| | | |
|---|---|---|
| DE | 10119302 | 10/2002 |
| DE | 19841547 A1 | 4/2004 |
| DE | 19841547 B4 | 4/2004 |
| FR | 2801302 | 5/2001 |

OTHER PUBLICATIONS

International Search Report, Nov. 18, 2003.
International Preliminary Examination Report w/ translation, Mar. 17, 2004.

* cited by examiner

STORAGE MEDIUM

The invention concerns a storage medium for the storage of information and data as well as a process for the storage and/or read-out of data in conjunction with such a storage medium.

Storage media for the storage of information and data are sufficiently known. To archive a large volume of data in computer applications, for example, use is often made of write-once or rewritable CDs or DVDs, whose basic principle rests on a dye film applied onto a carrier disk on which, by altering the dyestuff molecule with the aid of a laser beam, it is possible to record information and/or retrieve information so recorded. Along with the technical limitation of storage capacity of such known storage media, a serious drawback lies in the fact that the dye composition in known storage media is not resistant to aging and will decompose especially under UV light irradiation, for example incident sunlight, so that with the passage of time the stored data is subject to potential loss.

Beyond that, plastic disks are often used as carrier materials for CDs and DVDs and these are particularly sensitive to scratching, so that in improper handling the loss of data may also occur by mechanical damage to storage media.

The task of the invention is to make available a storage medium and a related process for the storage and/or retrieval of data affording especially good safety against the loss of data due to mechanical damage or aging, in addition to elevated data density.

According to the invention, this task is solved by a storage medium comprising a dielectric, notably disk-shaped storage material, upon which a donor medium for metal-ions may be arranged or applied to at least one side. Such a storage medium may preferentially involve glass, in particular plate glass.

In such a storage medium, there is a possibility to elicit by means of irradiation of this storage medium by electromagnetic and/or particle radiation, in particular by laser irradiation, at least a local doping of the storage medium with metallic ions, diffusing from the donor medium into the storage medium by reason of the irradiation and a resultant warm-up of the storage and donor media.

For this kind of metallic ion doping, use is preferably made of silver, gold, platinum or copper ions, or any desired combination thereof. These metallic ions may be embedded in a donor medium which may be mounted or applied on at least one side of the storage medium and/or storage material, whereby the donor medium may be applied in any desired type and manner onto the dielectric storage material. For example, it is possible to paste a metallic-ion containing folio onto the storage material or alternatively, for example, apply the donor medium onto the storage medium by a printing process.

Thus, the donor medium may be applied already during the manufacture of the storage medium or subsequently, by the user, onto the storage medium.

Especially with a locally circumscribed irradiation of the storage medium, as for example with a focused radiation, particularly by means of a focused laser radiation, in spots of local warming, the metallic ions may be locally transferred in high concentrations from the donor medium into the storage medium, where the metallic ions are laid out particularly in the proximity of the surface.

As compared to known storage processes, for example with CDs or DVDs, such a storage medium according to the invention can also record onto the dielectric medium the information which then, according to the invention, consists of the absence or presence of an aggregation of metallic ions within the dielectric storage material. For example, with the rotary motion of a disk-shaped storage medium under a read/write beam, the information may for example be subsequently posted by local doping on to a helical track in the storage medium.

Even just the locally introduced metallic ions—the local range being competently determined by the size of the beam spot at the site of the storage in the storage medium—constitute information inasmuch as the locally elevated concentration of metal ions alters the index of refraction of the storage medium at this site, so that information stored in this fashion may be retrieved in a simple manner, for example by the same writing beam, perhaps with a different intensity, in that reflection or transmission in the area of the stored information causes a phase displacement of the beam.

By way of greater or lesser doping, there is a possibility here to store not only digital information, but analog information as well, since the intensity of doping may be made dependent for example on the intensity and duration of irradiation.

The transfer of metallic ions from the donor medium to the storage medium is preferably done in a low-temperature range, represented by temperatures below the transformation temperature of the dielectric material, as for example glass, whereby the transformation temperature, for example of glass, is given by the temperature at which the elastic properties of the glass shift into visco-elastic properties. Below this borderline temperature, which in the case of plate glass lies for ex. in the vicinity of 530° C., metallic ions may effectively be doped by the described method into the dielectric medium, especially glass.

In a further or alternative embodiment, there is the possibility by way of a local or uniform temperature elevation of the dielectric storage material above the transformation temperature, to carry out a reduction of the metallic ions present in the storage medium into metallic particles. Accordingly, in the wake of such a reduction, the information recorded in the metal consists of the localized arrangement of metallic clusters especially of spherical structure within the storage medium. Even by the arrangement of these metallic clusters within the storage medium, the optical properties of the storage medium change both in reflection and transmission, for example by discoloration, so that even this mode of storage may be utilized for extended archivation of data, since both the previously described aggregations of metallic ions as well as the accumulation of metal atoms are stable over extended periods of time and are substantially insensitive to customary everyday incidence of light.

Generally speaking, the reduction of the metallic ions present in the storage material occurs by heating the dielectric material above the transformation temperature, so that such reduction may take place for example by uniform heating, that is, tempering, of the entire storage medium above this temperature, following a previous local transfer of information in the form of metallic ions.

Alternatively, it is also possible to carry out the storage of information in such a way that in an initial process by means of an electromagnetic or particle irradiation the metallic ions are transferred from a donor medium locally in the storage material, and that in a second stage of the process, the metallic ions are reduced to metal atoms by an increase of the temperature above the transformation temperature, for example by increasing the intensity of radiation. Hence, doping and reduction may take place by one and the same beam, as for example by a focused laser beam. The two phases of the process may take place, for example, immediately the one after the other during irradiation in which the storage medium is heated up, whereby below the transformation temperature doping takes place, whereas after exceeding the transformation temperature reduction takes place.

Independent of the previously described process and storage medium, there is the possibility alternatively or in combination with the same to make use of a storage medium which already features an especially uniform metallic ion doping, whereby the metallic ion doping is already performed during the manufacturing process of the storage medium. In such a storage medium, the donor medium containing the metallic ions may be dispensed with or used subsidiarily.

According to the process of the invention, the storage of the information with such a storage medium may be accomplished, for example, by irradiation, for example electromagnetic or particle radiation, in particular with a laser beam, whereby the metallic ions present, for example, uniformly within the storage material are converted into metal particles and/or metal particle aggregations within the local area of irradiation. To this end, it is essentially necessary to make sure that in the area of the desired storage zone the radiation does accomplish local warming of the dielectric storage material above the transformation temperature or that some other suitable energy transfer takes place.

By way of such reduction of metallic ions into metal particles or metal particle aggregations storage of information takes place within the storage medium, as previously described.

In particular where glass is the dielectric storage material, the resultant reduction above the transformation temperature may be explained by metal oxides, for example iron oxide and tin oxide, customarily present in the glass. These metal oxides occurring in the glass yield low-grade metallic ions capable of oxidizing the metallic ions introduced by the previously described processes, thus acting as native reduction agents. This effect is particularly significant in the case of plate glass, for example poured from a tin bath and therefore featuring on at least one side a very high concentration of tin ions.

Along with the possibility of carrying out reduction by reducing agents inherent in the glass and local, and/or uniform elevation of temperature above the transformation temperature, there is also a possibility to reduce metallic ions by external reducing agents.

Silver ions in particular lend themselves to effective reduction in a hydrogen atmosphere by the diffusion of hydrogen in the glass. Hence there is a possibility in a storage medium in which information is present by way of local metallic ion doping, to convert the local ion aggregations into metal particle accumulations by subsequent tempering in a hydrogen atmosphere.

Any desired radiation may be utilized to accomplish the above-mentioned radiation effects of local doping and/or local reduction of metal ions. For example, electro-magnetic radiation (e.g., gamma, X-ray), in particular laser radiation, particle radiation, ion radiation, etc may be used.

For recording and retrieval of information by means of a laser beam, use may be preferably made of a $CO_2$ laser as well as a laser in the visible range, particularly in the blue wavelength range. Precisely by irradiating a storage medium with $CO_2$ laser radiation in the long wave infrared range, it is possible to create effective local heating of the glass or in general of the dielectric medium. Nevertheless, in the case where $CO_2$ laser radiation is utilized, the information density is limited by the very elevated wavelength.

More advantageous is the use of shortwave laser radiation which allows greater information density, for example in the blue wavelength range. Precisely this range of wave lengths is ideally suited, since first of all by local heating of the material it is possible to form metal nuclei, in particular silver atom nuclei based on the previously described reduction process, whereby thereafter, in particular once the spherical metal particle nuclei are formed, an agglomeration of metal atoms occurs. The size of such an agglomeration may be affected in particular by the duration and intensity of radiation.

The use of a blue laser beam lends itself most especially since, due to the presence of spherical metal particles inside the storage material, optical polarization of the particles, that is, the excitation of a collective oscillation of the conduction electrons against the atomic core is triggered within the metal particles. Such collective oscillations are referred to as surface plasmons, whereby absorption resonances develop particularly for the metallic silver in the blue wavelength range, so that the formation of metal particles may be carried out in a particularly effective manner even via the resonance absorption of the blue wavelength by means of such surface plasmon resonance.

Accordingly, by way of such resonance-enhanced radiation absorption, following the reduction of metallic ions into a metal particle nucleus, such a nucleus may effectively grow into a large aggregation of metal particles.

Following the storage of desired information, this information may subsequently be deleted by heating up the storage medium to a specific extent, thereby introducing a statistical distribution of the particles present in the storage material, such as would no longer permit a retrieval of the information.

In a further preferred embodiment of the invented storage material, the same is at least on one side provided with another film of material, for example a polymer. Such a film of material may for example serve as a protective layer.

As an alternative or supplement to the protective function, there is also the possibility for the layer of material to feature an optically functional structure. For example, provision may be made within the layer of material for information which may be utilized for the guidance of a read/write beam. Accordingly, a suitable device for the inscription and read-out of the storage media according to the invention may guide a read or write beam, for example a laser beam, consistent with the information stored in the supplemental layer of material, over the surface of the storage medium and thereby record data onto the medium by way of the previously described process, or even read out stored data.

Inasmuch as in the previously described possibilities of local or even uniform doping of a dielectric storage material with metallic ions, such metallic ion doping may be arranged proximate to at least one side, especially near the surface of the storage material, it is advisable in a preferred embodiment for the layer of material capable of acting as a protective layer and/or as a supplemental information layer to be arranged on that surface of the storage medium which features the metallic ion doping in the proximity of the surface, thereby achieving simultaneously an effective protection of such metallic ion doping on the surface of the storage material.

The arrangement of at least one additional layer of material onto the storage material may be accomplished in a preferred manner by having the storage medium feature at least two interconnected disks, at least one of which comprises a storage material and another forms the above-described layer of material. Such disks or layers may be piled at will the one above the other, so that even multilayered storage media may be formed thereby, allowing for the storage of information on planes of different depth, whereby the corresponding read or write level may be chosen in particular by shifting the focus of the beams within the storage medium.

In this stratified build-up, particular protection may also be achieved in that the functional structure of the layer of material is arranged on the side of such layer facing the storage material. Accordingly, in conjunction with the above-described preferred embodiment, both the metallic ion doping near the surface as well as the functional structure, if any, of the layer of material are lying directly the one opposite the other, being thereby encapsulated within the two materials, that is, on the one hand the protective layer, if any, of the layer of material and on the other, of the dielectric material. Such interior encapsulation yields particularly effective protection against mechanical damage of both the functional structure as well as of the information stored within the doping layer.

Especially for a simplified read-out of stored information, provision may be made for the storage medium to feature a reflective film, arranged particularly on the layer of material, preferably between the layer of material and the storage material. Such reflective film may ideally coat the functional structure, for example the guiding track for a read or write laser, thereby simplifying the scanning of such functional structure, whereby at the same time the reflective film enables the read-out of the stored information in a reflective sequence.

Figure 1:
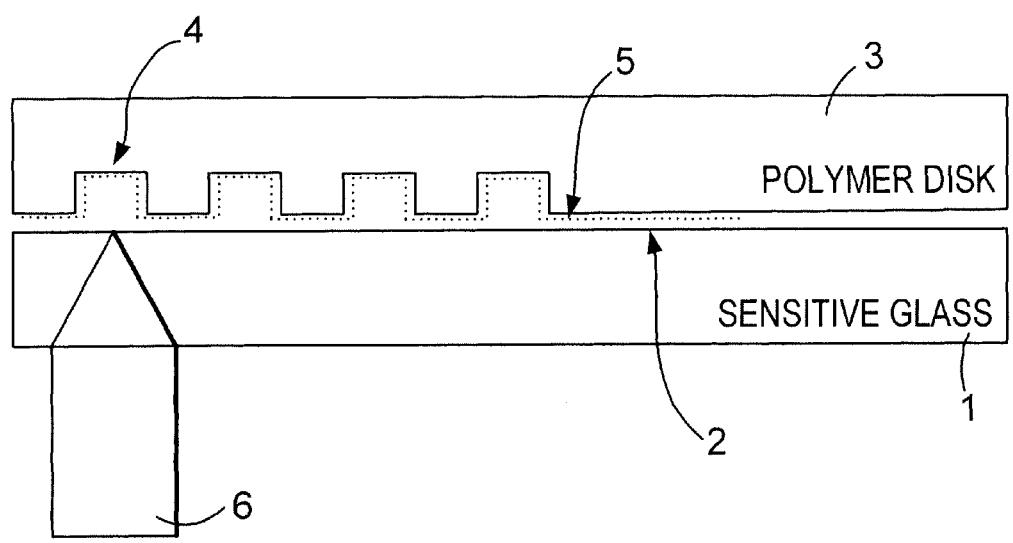
FIG. 1 illustrates a storage medium according to the invention.

A sample embodiment of the invention is further illustrated in the following FIGURE.

FIG. 1 illustrates a storage medium according to the invention, which may be termed a hybrid storage medium, consisting of a first disk-shaped sensitive doped glass 1 and a second surmounting polymer disk 3 arranged behind the glass in the direction of the laser beam. In the area of its surface 2, the glass disk 1 comprises metallic ion doping, evenly applied into the glass for example already during the process of manufacture.

The polymer disk 3 serves as protective disk for the metallic ion doping arranged in the proximity of the surface within the glass disk 1 and features moreover on its surface facing the glass disk 1 an optically functional structure in the form of a guidance track 4, extending for example helically relative to the mid-point of the two disks over the entire inner surface of the polymer disk 3. In addition, the inner surface of the polymer disk 3 facing the glass surface 2 containing the metallic ions, features for example an aluminum reflective film 5, extending uniformly over the polymer disk and the functional structure housed therein, thereby allowing for a particularly simple guidance of a read/write laser 6 in a reflective configuration, such as is known for example from the customary CDs and DVDs.

By reason of the fact that both the glass surface 2 featuring the metallic ion doping and the polymer disk surface featuring the functional structure are facing each other, and that the reflective film also comes to lie inside this bond, particularly good protection is afforded against mechanical damage of these three configurations. In a recording device utilizing such a storage medium according to the invention, the illustrated writing laser beam 6 may be guided by the guidance track 4, allowing for the desired information to be stored in a helical shape within the storage medium, that is, in the surface 2 region of the glass disk 1.

As the writing laser beam traverses the glass layer of the storage plate 1, the laser beam is broken and so adjusted by the pre-switched optics that the focus comes to lie on the desired writing plane, that is, near the surface 2 of the storage medium 1. Preferably, the glass surface forms the desired writing plane on the site of contact to the polymer, that is, on the reflective film. It is also feasible to shift the writing plane further into the interior of the glass disk 1.

The above described reduction process is accomplished by way of local heating of the storage medium 1 in the area of the writing plane, so that the evenly distributed metallic ions are reduced in the local area of heating, whereby the information is deposited in the storage medium. Particularly by way of this configuration, the reduction of the metallic ions into metallic particles causes staining of the glass in the area of the focus, which can then be simply utilized by reflection or transmission for repeatable read-out of the stored information Because of the insensitivity of the metallic ions as well as the metallic particles after reduction, an especially good long-term stability is achieved, far surpassing the stability of customary dye-based storage media.

The invention claimed is

1. A method of storing data on a storage medium, the method comprising the steps of:
   providing a storage medium having
      a glass storage disk having opposite faces,
      a layer of donor medium on one of the faces, and
      metallic ions in the layer of donor medium; and
   writing to the storage medium by irradiating the glass storage disk with focused electromagnetic or particle irradiation to transfer the metallic ions into the glass storage disk and reduce the metallic ions to metallic particles such that the metallic particles define the data being stored.

2. The method defined in claim 1 wherein the glass storage disk is irradiated along a helical track.

3. The method defined in claim 1, wherein the reduction of metallic ions is effected by heating the glass storage disk with a focused laser beam above the transformation temperature of the glass of the glass storage disk.

4. The method defined in claim 1, wherein the glass storage disk is irradiated through the other of its faces.

5. The method defined in claim 1, wherein the data stored can be read by
   irradiating the glass storage disk with electromagnetic or particle irradiation through the glass storage disk.

6. The method defined in claim 1, wherein the reduction of metallic ions is done by a laser beam in a visible spectral region.

7. The method defined in claim 1, wherein the
   data stored can be deleted by heating the storage medium.

8. The method defined in claim 1, wherein analog data is stored by varying an intensity of the focused electromagnetic or particle irradiation.

9. The method defined in claim 1, wherein the storage medium further has:
   a polymer disk on the one face, and
   a reflective coating between the layer of donor medium and the polymer disk.

* * * * *

UNITED STATES PATENT AND TRADEMARK OFFICE
CERTIFICATE OF CORRECTION

| | | |
|---|---|---|
| PATENT NO. | : 7,892,721 B2 | Page 1 of 1 |
| APPLICATION NO. | : 10/531962 | |
| DATED | : February 22, 2011 | |
| INVENTOR(S) | : Cioc et al. | |

It is certified that error appears in the above-identified patent and that said Letters Patent is hereby corrected as shown below:

On the title page insert item

-- 73 Gerhard FEHR, Kleve (DE) and BORAIDENT GMBH, Halle/Saale (DE) --

Signed and Sealed this
Twentieth Day of September, 2011

David J. Kappos
*Director of the United States Patent and Trademark Office*